United States Patent [19]
Miyamoto

[11] Patent Number: 6,040,021
[45] Date of Patent: Mar. 21, 2000

[54] PLASMA CVD PROCESS FOR METAL FILMS AND METAL NITRIDE FILMS

[75] Inventor: Takaaki Miyamoto, Kanagawa, Japan

[73] Assignee: Sony Corporation, Tokyo, Japan

[21] Appl. No.: 08/994,993

[22] Filed: Dec. 19, 1997

[30] Foreign Application Priority Data

Dec. 24, 1996 [JP] Japan ................................ P08-343678
Jun. 25, 1997 [JP] Japan ................................ P09-169027

[51] Int. Cl.[7] ................................ B05D 3/06; C23C 16/00
[52] U.S. Cl. ..................... 427/576; 427/535; 427/571; 427/253; 427/124; 427/126.1; 204/192.15; 204/298.11
[58] Field of Search ..................... 427/576, 571, 427/253, 535, 307, 124, 126.1; 204/192.15, 298.11; 438/656, 680, 685

[56] References Cited

U.S. PATENT DOCUMENTS

| | | | |
|---|---|---|---|
| 4,294,678 | 10/1981 | Kuehnle ............................ | 204/192 R |
| 4,777,061 | 10/1988 | Wu et al. ............................ | 427/39 |
| 5,271,817 | 12/1993 | Brugge et al. ..................... | 204/192.12 |
| 5,358,615 | 10/1994 | Grant et al. ........................ | 204/192.15 |
| 5,529,670 | 6/1996 | Ryan et al. ......................... | 204/192.15 |
| 5,595,784 | 1/1997 | Kaim et al. ........................ | 427/255.2 |
| 5,716,870 | 2/1998 | Foster et al. ....................... | 437/192 |
| 5,747,384 | 5/1998 | Miyamoto .......................... | 438/685 |

FOREIGN PATENT DOCUMENTS 63-3436   1/1988   Japan .
5-121358  5/1993   Japan .

*Primary Examiner*—Roy V. King
*Attorney, Agent, or Firm*—Hill & Simpson

[57] ABSTRACT

A plasma CVD process for a metal film made from Ti or the like and a formation process of a metal nitride film made from TiN or the like. Each process solves problems on asymmetry of a film shape at an opening portion of a contact hole, corrosion of an underlaying material layer, remaining halogen in the film, and peeling of the film. In the plasma CVD using a mixed gas containing $TiCl_4$, $H_2$ and Ar, species for forming a Ti film is efficiently ionized and the Ti ions thus generated are made incident on a substrate to be processed in the direction substantially perpendicular to the substrate, to thus form a metal film being good in coverage. A metal nitride film having a specific thickness is formed by repeating the step of forming such a metal film and the step of nitriding the metal film by plasma nitriding. The metal film or the metal nitride film is formed by vertically incident metal ions in such a manner as to be symmetrical, and to be thick at a bottom portion and thin at a side wall of the contact hole.

28 Claims, 10 Drawing Sheets

F I G. 2A
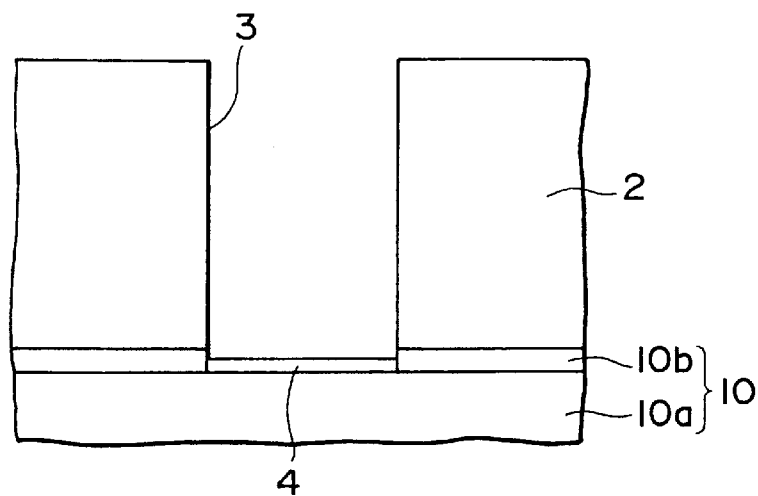
F I G. 2B
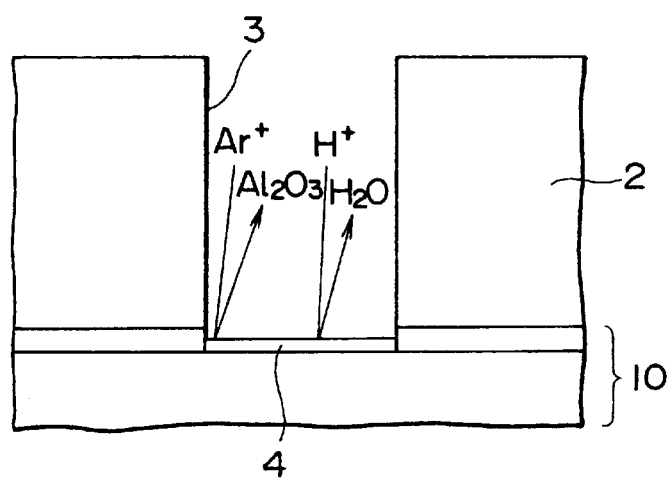
F I G. 2C
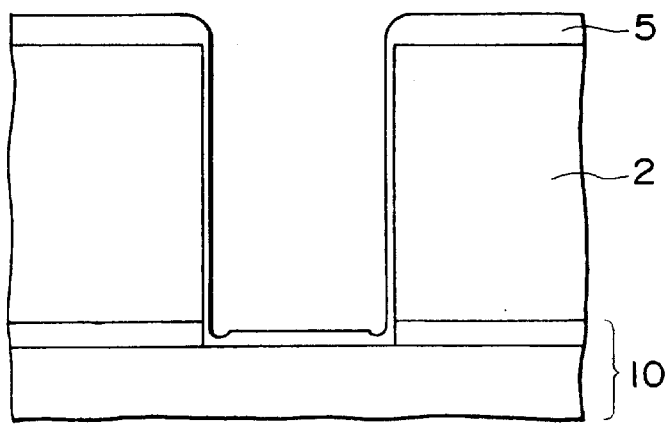

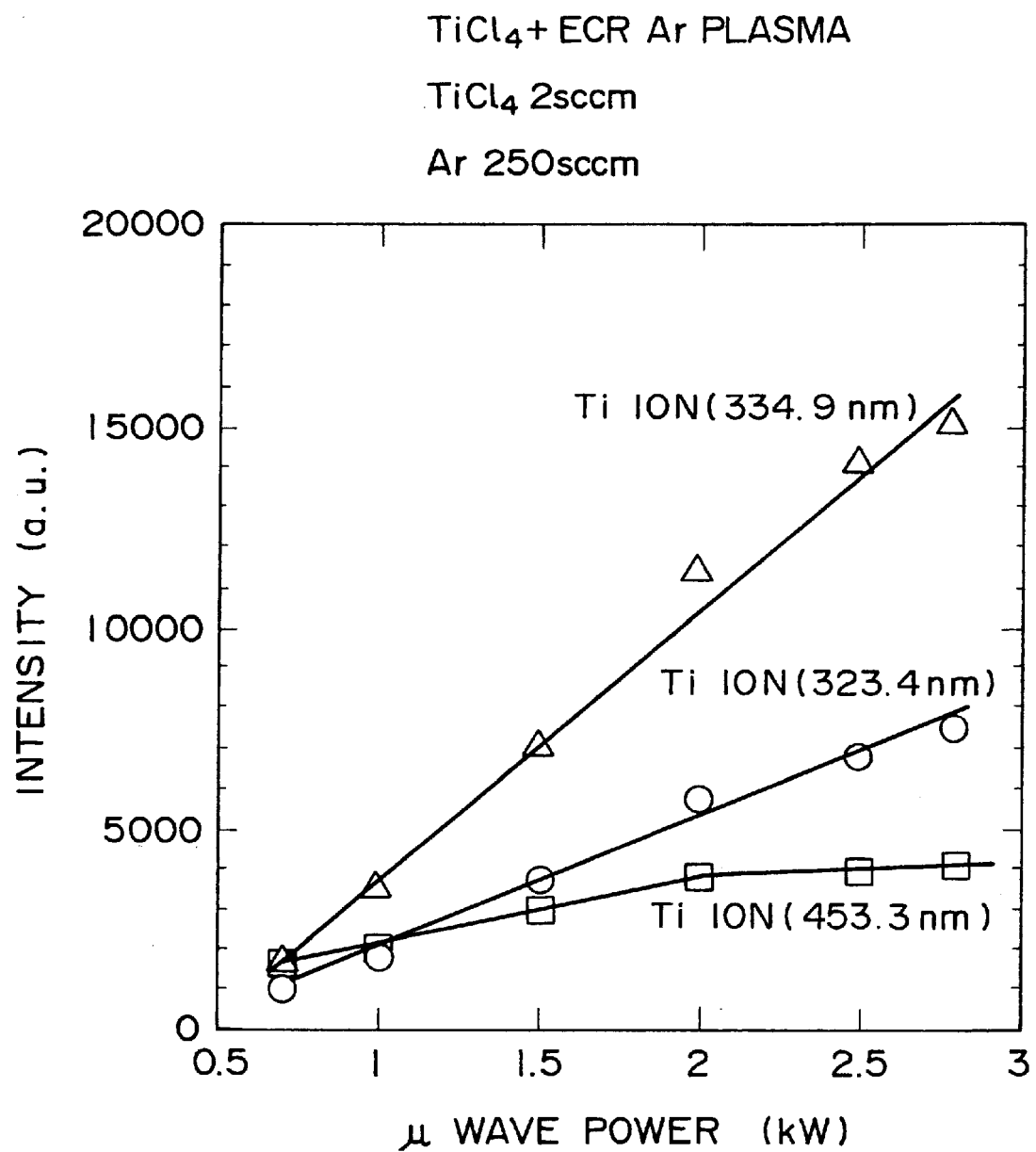

FIG. 10
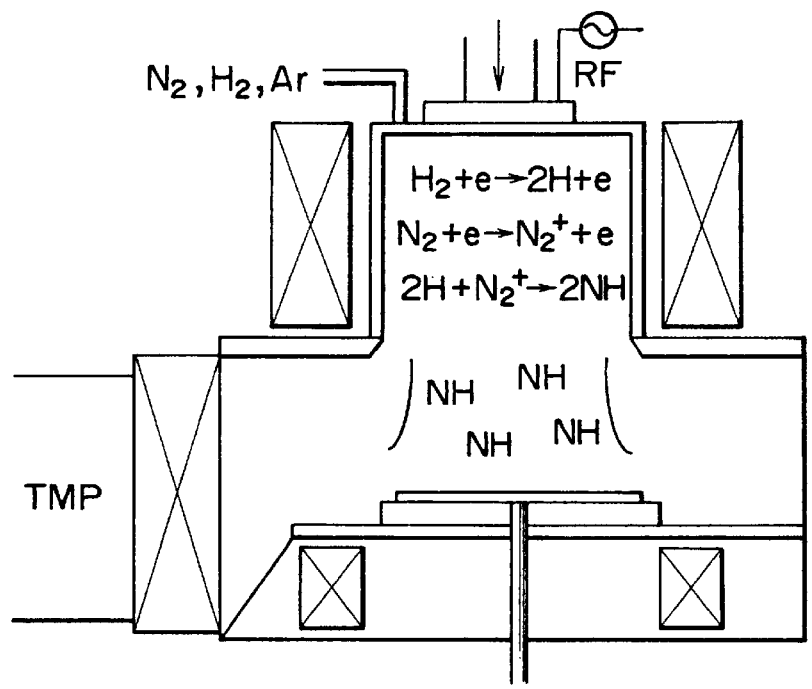
FIG. 11A
FIG. 11B
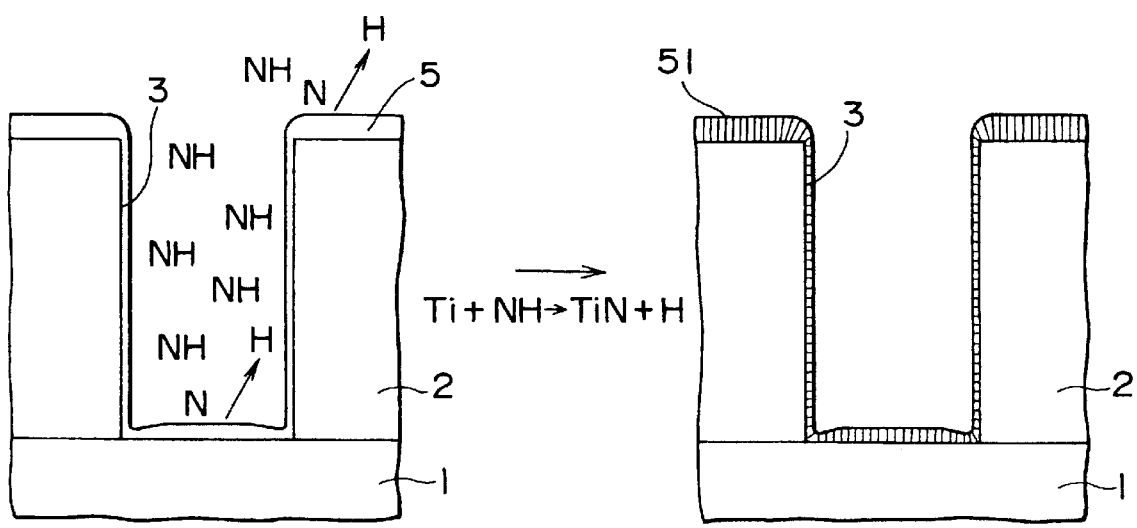

PLASMA CVD PROCESS FOR METAL FILMS AND METAL NITRIDE FILMS

BACKGROUND OF THE INVENTION

The present invention relates to a plasma CVD process for forming a metal film used for a step of fabricating a semiconductor device, a process for forming a metal nitride film used for a step for fabricating a semiconductor device, and a semiconductor device using a metal film or metal nitride film formed by the above process. In particular, the present invention relates to a plasma CVD process for a metal film and a formation process for a metal nitride film which are intended to reduce the amount of a halogen element remaining in a film formed, to improve a homology of a film, and to improve the symmetry of the coverage of a film, and a semiconductor device using a film formed by the above process.

The design rule of semiconductor devices such as LSIs is being made finer from a quarter-micron level to a sub-quarter micron level and also a multi-layered interconnection structure is being extensively used. With such a tendency, the aspect ratio of a contact hole for connecting an upper layer interconnection to a lower interconnection becomes larger. For example, in a semiconductor device having a design rule of 0.18 μm, the opening diameter of a contact hole is 0.2 μm and the thickness of an interlayer insulating film is in a range of about 1.0 to 2.0 μm, and consequently the aspect ratio is in a range of 5 to 10. To achieve a multi-layered interconnection structure with a high reliability through such a contact hole having a fine diameter and a high aspect ratio, there is generally adopted a method of forming in the contact hole a metal film made from Ti or the like for ohmic contact and a thin metal nitride film made from TiN or the like as a barrier metal for preventing diffusion of an interconnection material, and forming a contact plug or an upper interconnection layer by high temperature sputtering of an Al based metal or selective CVD or blanket CVD of tungsten (W), thereby filling the contact hole therewith.

In general, a Ti film or a TiN film is formed by sputtering or reactive sputtering using a bulk Ti metal as a target metal. Such a sputtering process, however, fails to solve a problem on step coverage. To solve the problem, there is expected a method of forming a conformal Ti film or TiN film by CVD using chemical reaction on the surface of the substrate to be processed.

The CVD processes for forming a film made from a Ti based material, which have been proposed at the present time, is mainly classified into two types. One type uses an organic metal compound such as TDMAT or TDEAT, as reported, for example, in Proc. 11th. Int. IEEE VMIC, pp. 440 (1994). The other type uses an inorganic metal halide such as $TiCl_4$, as reported, for example, in the Proceedings of the 44th Symposium of Institute of Semiconductor/Integrated Circuit Technique, pp. 31 (1993).

In the latter type thermal CVD process for forming a Ti film, reduction between $TiCl_4$ as a metal halide and molecules of $H_2$ is an endothermic reaction expressed by the following chemical equation (1). This reaction slowly proceeds from the viewpoint of thermodynamics (ΔG in the equation indicates a standard heat of formation). The shape of the film formed in this thermal CVD is conformal. To be more specific, the film is uniformly deposited on both a bottom surface and a side wall of the contact hole, so that the opening width of the contact hole is made narrow. This makes it difficult to bury the contact hole with tungsten or the like.

$$TiCl_4 + 2H_2 \rightarrow Ti + 4HCl \Delta G = 393.3 \text{ kJ/mol} \tag{1}$$

To cope with such an inconvenience, there is proposed a process of forming a Ti film by plasma CVD in which $H_2$ is dissociated in a plasma and a metal halide such as $TiCl_4$ is reduced by H atoms or activated species of H. The reaction is an exothermic reaction expressed by the following chemical equation (2):

$$TiCl_4 + 4H \rightarrow Ti + 4HCl \Delta G = -478.6 \text{ kJ/mol} \tag{2}$$

In this process, since the reaction easily proceeds as shown in the chemical equation (2), a Ti film can be formed at a relatively low temperature by plasma CVD. In particular, in this process, plasma CVD using a high density plasma source such as an ECR (Electron Cyclotron Resonance) plasma, ICP (Inductively Coupled Plasma) or helicon wave plasma is advantageous in terms of formation rate and uniformity of the film.

In plasma CVD using such a high density plasma source, however, there may occur an inconvenient state in which $TiCl_4$ is not sufficiently reduced by H atoms or activated species of H in some film formation conditions. In this case, a nucleus density exerting an effect on growth of the Ti film is small, and thereby the Ti film grows non-uniformly, resulting in a granular homology of the film.

Also, in the case where $TiCl_4$ is not sufficiently reduced, a lot of non-reacted $TiCl_4$ or subchlorides of Ti, that is, $TiCl_x$ (x is a natural number selected from 1, 2 and 3) remain in the plasma. In such a case, a underlaying conductive material layer such as a silicon substrate is etched in accordance with the following chemical equation (3).

$$TiCl_4 + 3Si \rightarrow TiSi_2 + 4SiCl_4 \Delta G = -32.2 \text{ kJ/mol} \tag{3}$$

Such corrosion of the silicon substrate may break a shallow impurity diffusion layer on the surface of the silicon substrate, to thereby cause a serious defect such as the increased leak current.

Further, in the case where reduction of $TiCl_4$ is imperfect, $TiCl_x$ or chlorine atoms are entrapped in a Ti film formed, so that the amount of chlorine remaining in the Ti film is increased. As a result, an Al based metal layer formed at the subsequent step may be corroded, and accordingly the contact resistance of the layer is increased, and in the worst case, there occurs disconnection of the layer.

Another problem is that unreacted $TiCl_4$ or $TiCl_x$ acts as dust in a chamber. To be more specific, unreacted $TiCl_4$ or $TiCl_x$ tends to be easily stuck and deposited on an inner wall of a CVD chamber. The deposits of unreacted $TiCl_4$ or $TiCl_x$, which contain chlorine in a large amount, are poor in adhesion with the inner wall, so that the deposits are simply peeled therefrom by thermal change due to turn-on/off of generation of plasma, to thereby deteriorate the particle level in the chamber or on the substrate to be processed.

Besides, various examinations have been made on formation of a TiN film by CVD such as thermal CVD, plasma CVD or MOCVD.

Of these plasma CVD processes, the thermal CVD process adopts a mixed gas reaction system between $TiCl_4$ and $NH_3$. This method has a merit in enhancing step coverage; however, when being applied to a substrate having a fine contact hole, it is disadvantageous in that a film is formed in a conformal shape both on a bottom surface and a side surface of the contact hole, and thereby an opening width of the contact hole is made narrow. This makes it difficult to fill the contact hole with tungsten by CVD or the like at the subsequent step. Specifically, in this case, there may occur a problem that a void is formed in the contact hole filled with tungsten, to thereby increase the contact resistance and reduce the reliability.

Further, in the mixed gas reaction system between $TiCl_4$ and $NH_3$, solid particles of ammonium chloride are produced as a reaction sub-product, which also deteriorate the particle level in the chamber or on the substrate to be processed.

For this reason, there has been proposed a method of burring a contact hole with a TiN film itself by thermal CVD; however, since the resistivity of TiN is about 10–30 times larger than that of tungsten, and consequently there may also occur a problem that the contact resistance is increased.

In plasma CVD, particularly, in plasma CVD using a high density plasma source for forming a TiN film, neutral species of TiN are produced by a mixed gas reaction system among $TiCl_4$, $N_2$ and $H_2$, which allows effective film formation at a temperature of 500° C. or less.

In a plasma CVD process for forming a Ti film or TiN film of a type in which incidence of species for film formation on a substrate to be processed is controlled by a divergent magnetic field, the incident direction cannot be sufficiently controlled because neutral species of $TiCl_x$ or $TiCl_4$ are electrically neutral. In other words, at a peripheral portion of the substrate to be processed, the obliquely incident direction of the species toward the outer periphery of the substrate to be processed cannot be corrected. As a result, at a stepped portion of the peripheral portion of the substrate to be processed, for example, at a bottom portion and a side wall of a contact hole, the film is formed in an asymmetric shape in which one side is thin and the other side is thick. Such an asymmetry of coverage of the film becomes particularly inconvenient for a large diameter substrate of 8 inch or more.

To improve the asymmetry of coverage, there has been proposed a method of providing magnet coils for producing a mirror magnetic field under a substrate to be processed, thereby converging the flow of plasma at a peripheral portion of the substrate to be processed. The plasma CVD using such an electromagnetic configuration controls the incident direction of electrically charged species for film formation, and thereby it exhibits a certain effect on improvement in symmetry of coverage; however, such a plasma CVD fails to control the incident direction of neutral species for film formation.

Referring to FIGS. 12A and 12B, there will be described a problem resulting from the asymmetry of coverage of a TiN film indicated by reference numeral 51 in the figures.

FIGS. 12A and 12B show one side of an opening portion of a contact hole 3 formed in an interlayer insulating film 2 at a peripheral edge portion of a substrate to be processed, wherein the left side in the figures is equivalent to the center direction of the substrate to be processed. Neutral species of TiN flying obliquely from the center direction of the substrate to be processed allows a TiN film 51 to be grown in an overhang shape in the opening portion of the contact hole on the incident side of the neutral species of TiN. As a result, a necking portion 6 at which the thickness of the TiN film 51 is extremely small is formed directly under the overhang portion (see FIG. 12A).

Thus, upon formation of a W film 7 by CVD at the subsequent step, $WF_6$ as a source gas passes through the thin TiN film 51 at the neck portion 6 and reaches the Ti film 5, so that $TiF_x$ is produced by reaction between $WF_6$ and Ti film 5 and finally a mixture 8 of $TiF_x$ and W is produced. The mixture 8 of $TiF_x$ and W is weak in adhesive strength, and thereby the TiN film 51 is floated and peeled as shown in FIG. 12B. The peeling of the TiN film 51 not only reduces the reliability of a multi-layered interconnection but also becomes a cause of dust.

SUMMARY OF THE INVENTION

An object of the present invention is to provide a plasma CVD process for forming a metal film made from Ti or the like using a source gas containing a metal halide such as $TiCl_4$, $H_2$, and a noble gas, which is capable of reducing the amount of a halogen element such as chlorine remaining in the metal film, achieving a good symmetry of coverage and a smooth homology of the metal film, and ensuring a high reliability by preventing corrosion of a underlaying conductive material layer.

Another object of the present invention is to provide a process for forming a metal nitride film made from TiN or the like, which is capable of achieving a good symmetry of coverage of the film, and ensuring a high reliability by preventing peeling of the film.

A further object of the present invention is to provide a high integrated semiconductor device with a high reliability, which has as electrode and interconnection materials a metal film and/or a metal nitride film formed by the above film formation processes.

To achieve the first object, according to the present invention, there is provided a plasma CVD process for forming a metal film on a substrate to be processed using a source gas containing a metal halide gas, hydrogen gas, and a noble gas, the process including the steps of: reducing the metal halide by activated hydrogen species in a plasma to generate neutral species of a metal; making the neutral species of the metal collide with at least one kind of activated species of the noble gas and electrons in the plasma to generate metal ions; making the metal halide collide with at least one kind of the activated species of the noble gas and the electrons in the plasma to generate metal ions and neutral species of a halogen; reducing the neutral species of the halogen by the activated hydrogen species in the plasma to generate a hydrogen halide; and making the metal ions thus generated incident on a principal surface of the substrate to be processed in the direction substantially perpendicular to the principal surface.

To achieve the second object, according to the present invention, there is provided a process for forming a metal nitride film by nitriding a metal film formed on a substrate to be processed, including the steps of: forming the metal film on the substrate to be processed by plasma CVD using a source gas containing a metal halide gas, hydrogen gas, and a noble gas; nitriding the metal film thus formed by plasma nitriding; and repeating a plurality of times the step of forming the metal film and the step of nitriding the metal film thus formed; wherein the step of forming the metal film by plasma CVD further includes the steps of: reducing the metal halide by activated hydrogen species in a plasma to generate neutral species of a metal; making the neutral species of the metal collide with at least one kind of activated species of the noble gas and electrons in the plasma to generate metal ions; making the metal halide collide with at least one kind of the activated species of the noble gas and the electrons in the plasma to generate metal ions and neutral species of a halogen;reducing the neutral species of the halogen by the activated hydrogen species in the plasma to generate a hydrogen halide; and making the metal ions thus generated incident on a principal surface of the substrate to be processed in the direction substantially perpendicular to the principal surface.

To achieve the second object, according to the present invention, there is also provided a process for forming a metal nitride film by nitriding a metal film formed on a substrate to be processed, including the steps of: forming the metal film on the substrate to be processed by sputtering a metal target using noble gas ions, making metal particles thus sputtered collide with at least one kind of the noble gas ions and electrons to generate metal ions, and making the metal ions incident on a principal surface of the substrate to be processed in the direction substantially perpendicular to the principal surface; nitriding the metal film thus formed by plasma nitriding; and repeating a plurality of times the step of forming the metal film and the step of nitriding the metal film, thereby forming a metal nitride film to a specific thickness.

To achieve the third object, according to the present invention, there is provide a semiconductor device having as a member such as an electrode or interconnection either the metal film formed by the above plasma CVD process or a metal silicide film by silicidation from the metal film.

To achieve the third object, according to the present invention, there is provided a semiconductor device having as a member such as an electrode or an interconnection the metal nitride film formed by the above process of forming a metal nitride film.

As the metal halide adopted in the present invention, there may be used a metal chloride, a metal bromide, or a metal iodide. Concretely, there may be preferably used a Ti halide such as $TiCl_4$ (mp=−25° C., bp=136° C.), $TiBr_4$ (mp=39° C., bp=230° C.) or $TiI_4$ (mp=150° C., bp=377.1° C.). In particular, $TiCl_4$ is more preferably used because it is in a liquid state at room temperature and thereby it is simple in its handling. These titanium halide as organic Ti compounds may be introduced in a plasma CVD chamber by a known burning method or a heating bubbling method using a carrier gas.

As the plasma CVD system adopted in the plasma CVD process of the present invention, there may be preferably used a plasma CVD system having a high density plasma source such as an ECR plasma CVD system or a helicon wave plasma CVD system in terms of formation rate and uniformity of a film. Magnet coils for producing a mirror magnetic field and a high permeability magnetic body such as Permendur may be disposed under a susceptor of the plasma CVD system.

As the sputtering system adopted in the method for forming a metal nitride film according to the present invention, there may be used a general diode sputtering system added with a substrate bias inputting means, and a plasma generating means such as an inductively coupling coil for ionizing a noble gas such as Ar gas at a high efficiency. As the sputtering system, there may be also used an ECR sputtering system or an ion beam sputtering system.

Next, the function of the present invention will be described.

The steps of the plasma CVD process for forming a metal film according to the present invention will be described by example of $TiCl_4$ as a metal halide.

(1) In the first step, a mixed gas of hydrogen gas and a noble gas is excited by a high density plasma source, to generate activated hydrogen species such as H atoms and H ions.

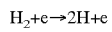

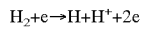

(2) In the second step, part of the metal halide is dissociated at a high efficiency by the activated hydrogen species, to generate neutral species of a metal. This reaction is an exothermic reaction (a standard heat of formation: −478.6 kJ/mol) and thereby it easily proceeds.

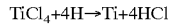

(3) In the third step, the neutral species of the metal is made to collide with electrons and ions of the noble gas, to generate ion species of the metal.

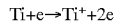

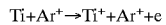

(4) In the fourth step, preferably, the other part of the metal halide is made to collide with electrons or activated species of the noble gas having an energy more than an ionizing energy for the metal, to generate ion species of the metal, and neutral species of a halogen as a reaction sub-product is reduced by the activated hydrogen species.

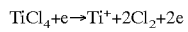

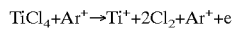

(ionizing energy of Ti: 6.836 eV)

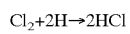

(standard heat of formation: −621.4 kJ/mol, exothermic reaction)

(5) In the fifth step, the ion species of the metal obtained in the steps (3) and (4) are derived toward a substrate to be processed by a divergent magnetic field, and are made incident on the substrate in the direction substantially perpendicular to the substrate by magnet coils and a high permeability magnetic body disposed on a back surface of the substrate.

With this configuration, an obliquely incident component of the species for film formation with respect to a substrate having a stepped portion of a high aspect ratio such as a contact hole can be excluded, and consequently a film can be formed only by a nearly vertically incident component of the species. Thus, a metal film having a good symmetry can be formed on a bottom portion of a contact hole of a high aspect ratio to a specific thickness without occurrence of any necking portion in a film shape at an opening portion of the contact hole in a peripheral portion of a substrate to be processed. Further, since the metal film is formed using the metal ions from which the halogen is perfectly eliminated by dissociation due to high energy plasma and the metal ions ionized from the neutral species of the metal from which the halogen is similarly eliminated, it is possible to sufficiently reduce the amount of the halogen remaining in the metal film and to prevent corrosion of an underlaying conductive material layer. Additionally, since the neutral species of the halogen as a reaction sub-product is reduced into hydrogen halide, and the hydrogen halide is readily removed from the CVD chamber, it is possible to further lower the amount of the halogen remaining in the metal film.

The feature of the process of forming a metal nitride film according to the present invention lies in that a metal nitride film is not directly formed on a substrate having a stepped portion, but a metal nitride film having a specific thickness and a specific shape is formed by repeating a step of forming a metal film into a good shape by the plasma CVD process or a specific sputtering process and a step of nitriding the metal film by plasma nitriding. The above plasma nitriding includes the following three steps:

(1) In the first step, a mixed gas of nitrogen gas, hydrogen gas, a noble gas is excited by a high density plasma source, to generate activated nitrogen species and activated hydrogen species.

$$N_2 + e \rightarrow N_2^+ + 2e$$

$$H_2 + e \rightarrow 2H + e, \quad H_2 + e \rightarrow H + H^+ + e$$

(2) In the second step, activated species of NH are formed by reaction of the activated nitrogen species with the activated hydrogen species.

$$N_2^+ + 2H \rightarrow 2NH$$

(3) In the third step, the species of NH are absorbed on the surface of the metal film, for example, the Ti film, being dissociated thereat, to react with metal lattices, thereby forming a metal nitride film.

$$Ti + NH \rightarrow TiN + H$$

With this plasma nitriding, a metal film, if it is as thin as several nm, can be sufficiently nitrided as a whole. In the case of requiring a metal nitride film having a larger thickness, the step of forming a metal film and the step of nitriding the metal film by plasma nitriding may be repeated until the thickness of the nitrided film reaches a specific value.

The process of forming a metal film prior to plasma nitriding is not limited to the above-described plasma CVD process. For example, the metal film may be formed by a sputtering process using a sputtering system added with a means of ionizing sputtered metal particles and a means of applying a substrate bias, thereby enhancing a ratio of a vertical incident component.

Such a process of forming a metal nitride film can be effectively applied to a substrate having a stepped portion, for example, a contact hole of a high aspect ratio. Specifically, a metal nitride film having a good symmetry can be formed on a bottom portion of the contact hole to a specific thickness without formation of a necking portion in the film shape at an opening portion of the contact hole. Further, it is possible to prevent deterioration of the particle level which occurs when a metal nitride film is directly formed.

By use of the plasma CVD process for a metal film and the formation process for a metal nitride film described above, a high integrated semiconductor device with a high reliability can be provided without occurrence of voids in a contact plug or the like of a multi-layered interconnection and of peeling of the film.

BRIEF DESCRIPTION OF THE DRAWINGS

FIGS. 2A to 2C are schematic sectional view showing steps of another plasma CVD process of the present invention;

FIG. 9 is a graph showing a relationship between emission intensities of Ti atoms and Ti ions and a microwave power applied upon ECR plasma CVD;

FIG. 10 is a schematic sectional view showing a plasma nitriding step using the plasma CVD system to which the present invention is applied;

FIGS. 11A and 11B are schematic sectional views showing steps of forming a metal nitride film according to the present invention.

DETAILED DESCRIPTION OF PREFERRED EMBODIMENTS

Hereinafter, preferred embodiments of the present invention will be described with reference to the accompanying drawings.

First, an ECR plasma CVD system used in the following examples of the present invention will be described with reference to FIG. 4.

Figure 4:
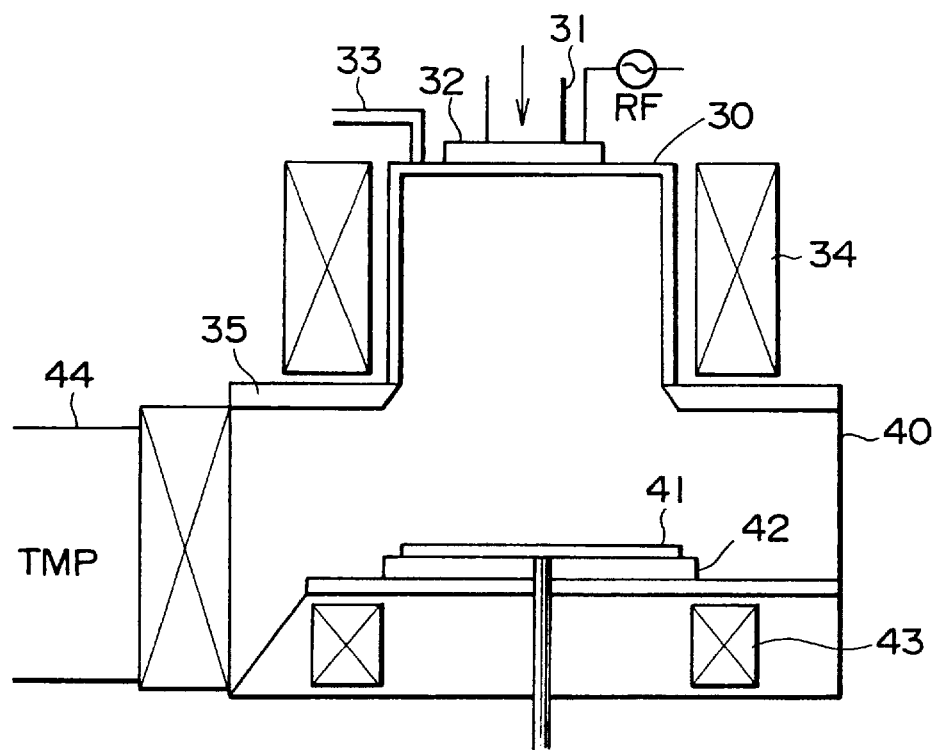
FIG. 4 is a schematic sectional view showing a configuration of a plasma CVD system to which the present invention is applied.

FIG. 4 shows a schematic configuration of an ECR plasma CVD system mainly including a plasma generating chamber 30 and a film forming chamber 40. A microwave of 2.45 GHz, which is generated by a magnetron (not shown), passes through a microwave guide 31 and enters in the plasma generating chamber 30 through a microwave inlet window 32. The microwave inlet window 32 is formed of a dielectric such as quartz or alumina. Actually, to prevent adhesion of a metal film to the microwave inlet window 32, the microwave inlet window 32 has an electrode (not shown) connected to a radio frequency power source, except for a central rectangular portion through which the microwave is introduced. Reference numeral 34 indicates a solenoid coil.

A gas inlet 33 for introducing hydrogen gas or a noble gas such as Ar is connected to the plasma generating chamber 30.

The film forming chamber 40 contains a susceptor 42 on which a substrate 41 to be processed is placed. Under the susceptor 42 magnet coils 43 for producing a mirror magnetic field are located. The susceptor 42 is also provided with a heating means (not shown), and a high permeability magnetic body (not shown) for correcting an incident angle of metal ions to the substrate at substantially right angles with respect to the substrate. Reference numeral 44 indicates a gas exhaust port connected to a vacuum pump through a conductance valve or the like.

Between the plasma generating chamber 30 and the film forming chamber 40 is symmetrically inserted a gas ring 35 for introducing a metal halide gas. It should be noted that details of other devices such as a means for carrying the substrate to be processed and a mass-flow controller are omitted in FIG. 4.

In the system having the above configuration, a mixed gas of hydrogen gas and a noble gas introduced from the gas inlet 33 is excited by a high density ECR plasma generated through a mutual action of a microwave of 2.45 GHz introduced from the microwave inlet window 32 and a magnetic field of 0.0875 T generated by the solenoid coil 34, to generate activated hydrogen species. Part of a metal halide introduced from the gas ring 35 is reduced into neutral species of a metal by the activated hydrogen species. The neutral species of the metal collide with ions of the noble gas and electrons, to be ionized, that is, to be converted into metal ions. On the other hand, the other part of the metal halide introduced from the gas ring 35 collides with activated species of the noble gas and electrons in the plasma, to be directly converted into metal ions. These metal ions are derived toward the substrate 41 to be processed by a gradient of a divergent magnetic field formed by the solenoid coil 34. The metal ions incident obliquely toward a peripheral portion of the substrate 41 is corrected in its incident direction by the magnet coils 43 for producing a mirror magnetic field and the high permeability magnetic body, to be thus made incident on the principal surface of the substrate 41 to be processed in the direction substantially perpendicular to the principal surface. By use of such a plasma CVD system, it is possible to form a metal film being good in symmetry of coverage.

Figure 5:
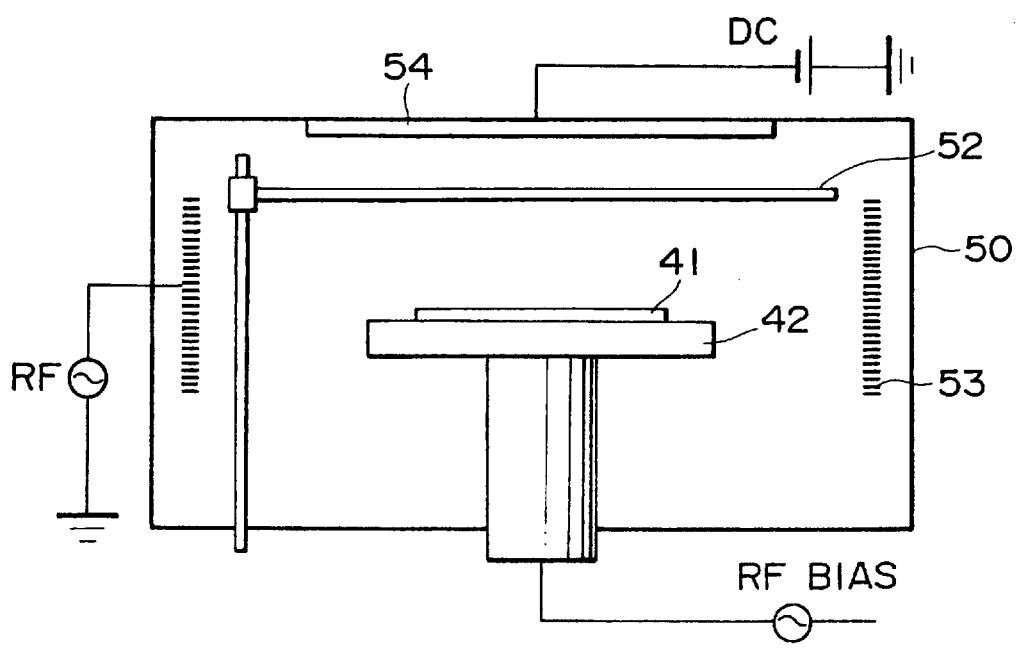
FIG. 5 is a schematic sectional view of a sputtering system to which the present invention is applied.

FIG. 5 is a schematic sectional view of one example of a sputtering system used in the following examples of the present invention. In FIG. 5, parts having functions similar to those in the ECR plasma CVD system shown in FIG. 4 are indicated by the common reference numerals.

The sputtering system has the same basic configuration as that of a general diode type DC sputtering system. In a sputtering chamber 50, a susceptor 42 on which a substrate 41 to be processed is placed is disposed opposite to a Ti target 54. A DC power source is connected to the Ti target 54 and a substrate bias power source is connected to the susceptor 42.

The feature of this sputtering system lies in that it includes an ICP coil 53 wound along an inner wall surface of the sputtering chamber 50 and a shutter 52 turnably provided in front of the Ti target 54. An ICP power supply of 13.56 MHz or 2 MHz is connected to the ICP coil 53. In the case where the wall surface of the sputtering chamber 50 is made from a dielectric material such as quartz, the ICP coil 53 may be wound around the outer periphery of the sputtering chamber 50. The shutter 52 is driven by a drive means (not shown) in such a manner as to allow the Ti target 54 to be exposed to or shielded from the excited plasma. In addition, details of parts such as a gas inlet or gas exhaust port are omitted in FIG. 5.

In the system having the above configuration, Ar, or a N-based gas such as $N_2$, $NH_3$ introduced in the sputtering chamber 50, or particles of Ti sputtered can be converted into plasma at a high efficiency. The system also can avoid an inconvenience that the Ti target 54 is nitrided to significantly lower the sputtering yield.

The present invention will be more clearly understood with reference to the following examples:

In the following first, second and third examples, a Ti film is formed using a mixed gas of $TiCl_4/H_2/Ar$ by the above ECR plasma CVD system.

EXAMPLE 1

In this example, a contact metal formed of a Ti film is formed in a contact hole opened facing an impurity diffusion layer formed on a semiconductor substrate. Such an example will be described below with reference to FIGS. 1A to 1C, FIGS. 6A and 6B, FIGS. 7A and 7B, and FIGS. 8A and 8B. It should be noted that the configuration of a system shown in FIGS. 6A to 8B is the same as that of the ECR plasma CVD system shown in FIG. 4, and therefore, reference numerals indicating parts of the system are omitted.

Figure 1A:
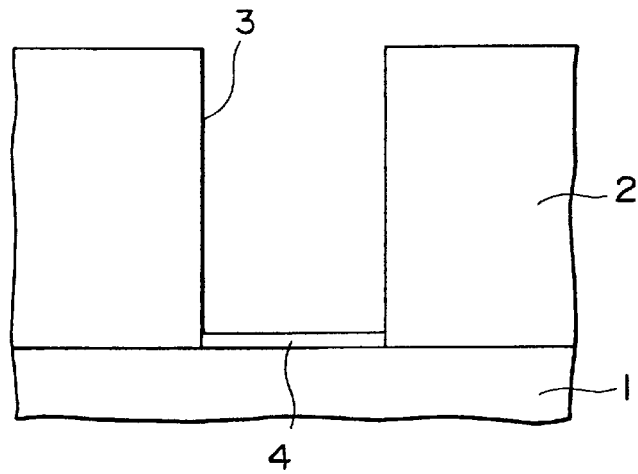
FIGS. 1A to 1C are schematic sectional views showing steps of a plasma CVD process of the present invention.

A substrate to be processed in this example has a configuration shown in an enlarged sectional view of FIG. 1A. For example, the substrate to be processed is prepared by forming an interlayer insulating film 2 made from silicon oxide on a semiconductor substrate 1 (diameter: 8 inch) made from silicon, and forming a contact hole 3 facing an impurity diffusion layer (not shown) formed on the semiconductor substrate 1. The thickness of the interlayer insulating film is 2 $\mu$m and the opening diameter of the contact hole 3 is 0.2 $\mu$m. That is, the aspect ratio of the contact hole 3 is about 10. In addition, a number of the contact holes 3 each having the same shape are actually formed in a central area and a peripheral area of the substrate to be processed.

Figure 6A:
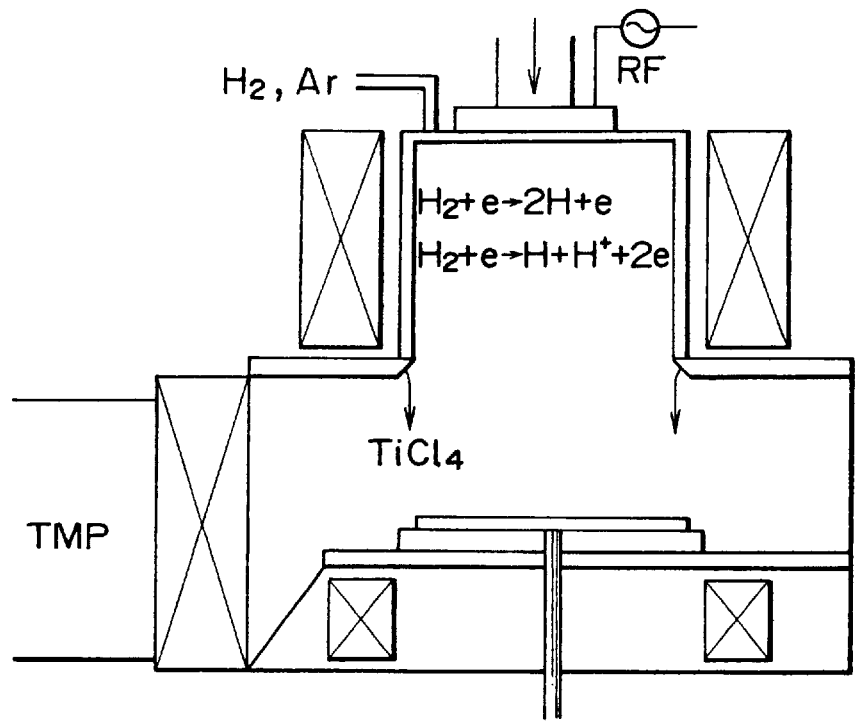
FIGS. 6A and 6B are schematic sectional views showing steps of forming a metal film using the plasma CVD system to which the present invention is applied.

A native oxide film and a contaminant on the surface of a portion of the semiconductor substrate 1 exposed at a bottom portion of the contact hole 3 are cleaned by diluted hydrofluoric acid. The substrate to be processed is then placed on the susceptor 42 of the ECR plasma CVD system shown in FIG. 4. In this state, a new native oxide film 4 is thinly formed on the bottom portion of the contact hole 3. A mixed gas of $H_2/Ar$ is introduced in the plasma generating chamber 30 through the gas inlet 33 and excited by plasma generated through discharge of ECR, to generate high energy electrons. This is because the life of Ar in the exciting state is longer one figure or more than the life of $H_2$ in the exciting state. Then, $H_2$ is dissociated by collision with the high energy electrons generated in the plasma, to generate activated hydrogen species such as H atoms and H ions. This state is shown in FIG. 6A.

Figure 6B:
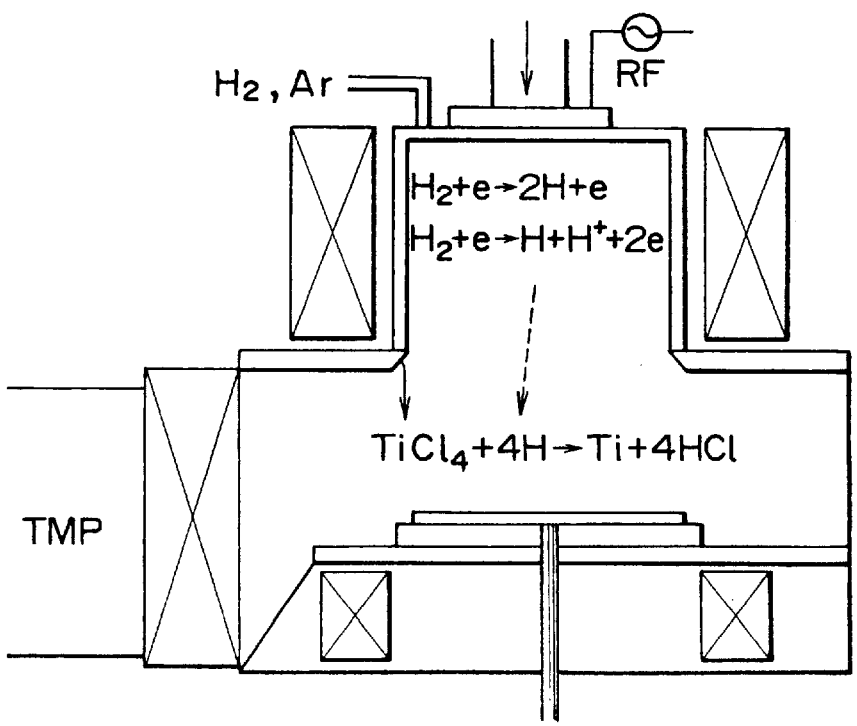

The plasma of the mixed gas of $H_2/Ar$ containing the activated hydrogen species is derived in the film forming chamber 40 by the gradient of the divergent magnetic field of the solenoid coil 34, and part of $TiCl_4$ gas introduced from the gas ring 35 into the film forming chamber 40 is reduced by the activated hydrogen species, to generate neutral species of Ti (see FIG. 6B). The generation of the neutral species of Ti can be monitored on the basis of peaks appearing at 374 nm and 453 nm in emission spectra.

One example of the plasma CVD condition is as follows:

flow rate of $H_2$: 80–140 sccm flow rate of Ar: 170–300 sccm flow rate of $TiCl_4$: 2–7 sccm microwave power: 2.8 kW (2.45 GHz)

substrate temperature: 300–460° C.

This plasma CVD condition, particularly, the ratio between the flow rates of the gases is set such that $TiCl_4$ can be sufficiently reduced by the activated hydrogen species. The ratio between the flow rates of the gases can be specified on the basis of a hydrogen atomic line and a change in emission intensity of chlorine, as proposed in the earlier application by the present inventor, Japanese Patent Laid-open No. Hei 7-336309.

Figure 7A:
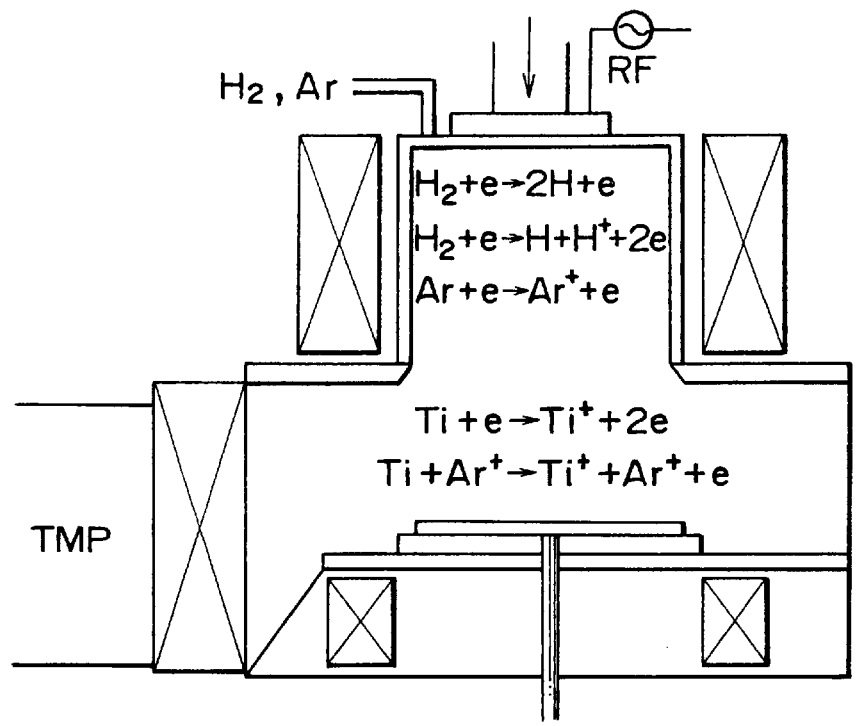
FIGS. 7A and 7B are schematic sectional views, continued from FIGS. 6A and 6B.

The neutral species of Ti generated by the above reduction collide with electrons and activated species of the noble gas, that is, Ar ions and excited Ar atoms in the plasma, to generate Ti ions as shown in FIG. 7A. The generation of Ti ions can be monitored in spectrometry of plasma emission on the basis of peaks appearing at 323 nm and 335 nm of Ti ions.

Besides, the other part of the $TiCl_4$ gas introduced from the gas ring 35 in the film forming chamber 40 collides with electrons and activated species of Ar in the plasma having an energy more than the ionizing energy of Ti, to directly generate Ti ions. At this time, a reaction by-product, $Cl_2$ as neutral species of the halogen, is reduced by the activated hydrogen species to be converted into hydrogen halide, that is, HCl which is readily exhausted from the chamber. This reduction is an exothermic reaction expressed by the following chemical equation and thereby it easily proceeds.

$Cl_2+2H \rightarrow 2HCl$ (standard heat of formation: −621.3 kJ/mol)

Figure 7B:
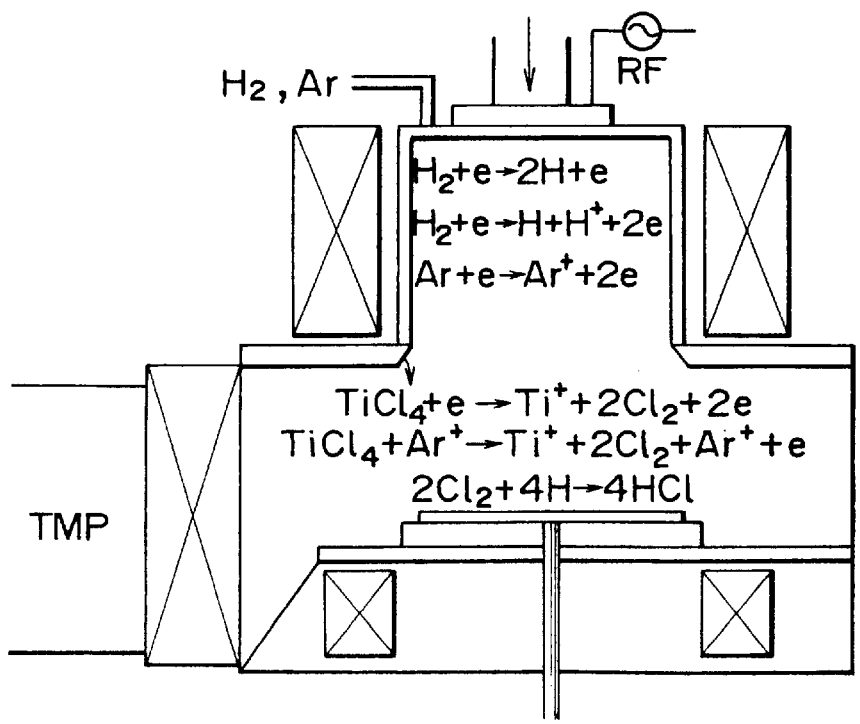

This state is shown in FIG. 7B. At this time, the microwave power of the plasma CVD condition described above is selected such that the electrons and the activated species of Ar in the plasma have an energy more than the ionizing energy of Ti. Such an exciting state of the plasma is specified, in spectrometry of plasma emission when a power for discharge of plasma is increased upon plasma CVD, on the basis of a region in which the emission intensity of metal atoms is substantially saturated and the emission intensity of metal ions is increased. Such a state will be more fully described with reference to FIG. 9.

FIG. 9 is a graph showing a relationship between emission intensities of Ti atoms and Ti ions and a microwave power applied upon ECR plasma CVD. As will be apparent from FIG. 9, in a region when the microwave power is 2 kW or more, the emission intensity of Ti atoms (453.3 nm) is substantially saturated while the emission intensity of Ti ions (323.4 nm and 334.9 nm) is increased. This is because in this region, the electrons and the activated species of Ar in the plasma have an energy more than the ionizing energy of Ti. To be more specific, in the region in which the microwave power is 2 kW or more, the $TiCl_4$ gas is dissociated at a high efficiency by the electrons and the activated species of Ar in the plasma to directly generate Ti ions. In this region, of course, the neutral species of Ti generated by reduction of the $TiCl_4$ gas is converted into Ti ions.

Figure 8A:
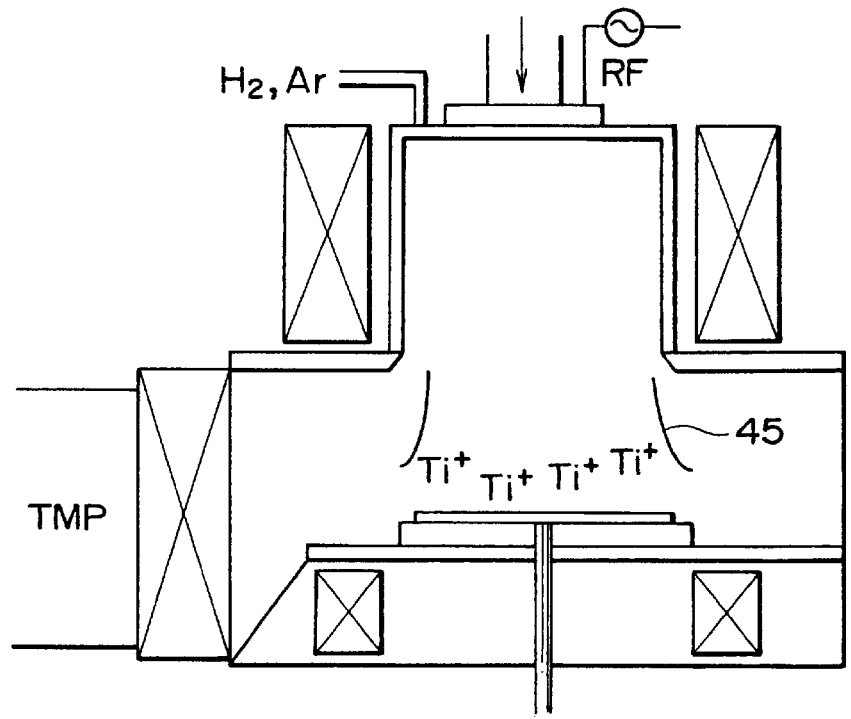
FIGS. 8A and 8B are schematic sectional views, continued from FIGS. 7A and 7B.

The Ti ions thus generated by these reaction steps are directed toward the substrate 41 to be processed by the gradient of the divergent magnetic field 45 (see FIG. 8A).

In this example, a mirror magnetic field 46 is formed by the magnet coils 43 disposed under the susceptor 42 for preventing an obliquely incident component of the Ti ions due to the divergent magnetic field 45 from being not directly made incident on the substrate 41 to be processed. On the back surface of the susceptor 42 is disposed the high permeability magnetic body (not shown). The vertically incident component of the Ti ions to the susceptor 42, which is enhanced by the mirror magnetic field 46, is further enhanced by the effect of the high permeability magnetic body functioning to attract the magnetic field.

Figure 8B:
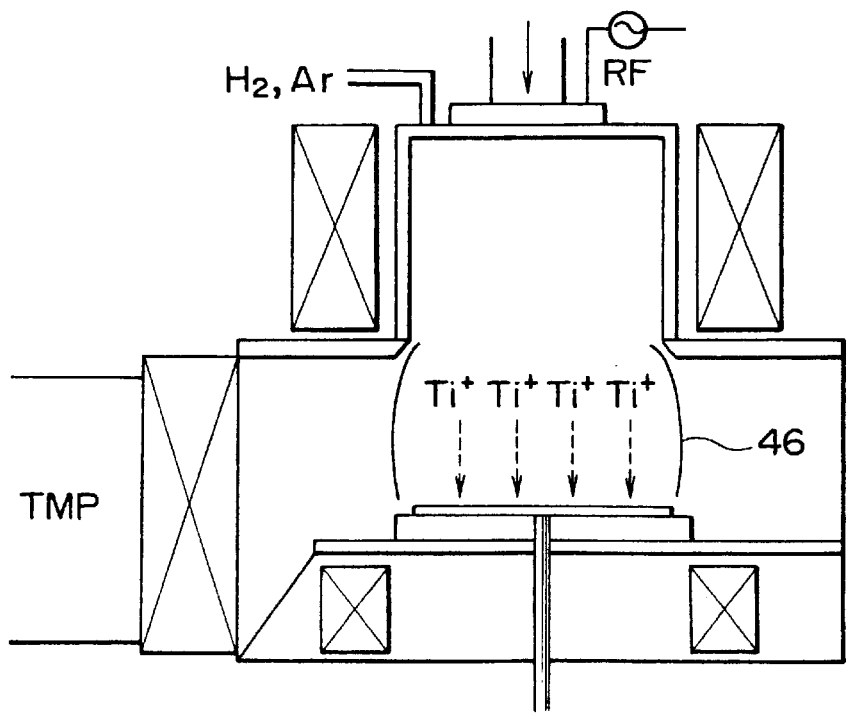
Figure 12A:
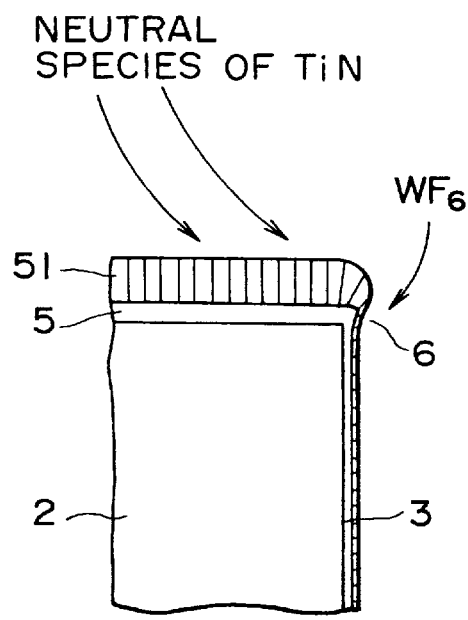
FIGS. 12A and 12B are schematic sectional view showing a problem in the related art steps of forming a metal nitride film.
Figure 12B:
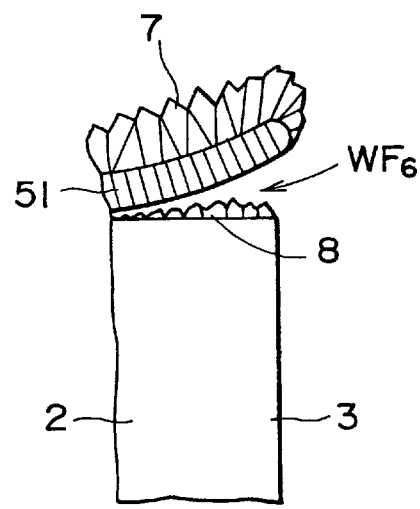

In addition to the above, the Ti ions are accelerated by a differential sheath potential (self-bias) due to floating which is formed on the substrate 41, so that they are made incident on the substrate 41 in the direction substantially perpendicular to the substrate 41 without any scattering, as shown in FIG. 8B. To prevent scattering of the Ti ions, a substrate bias being so weak as not to give ion damage to the substrate 41 may be applied to the susceptor 42.

The high permeability magnetic body may be formed of a uniform thin plate of Permendur (Fe—Co alloy) or Sendust (Fe—Al—Si alloy), and it may be disposed under or inside the susceptor 42.

Figure 1B:
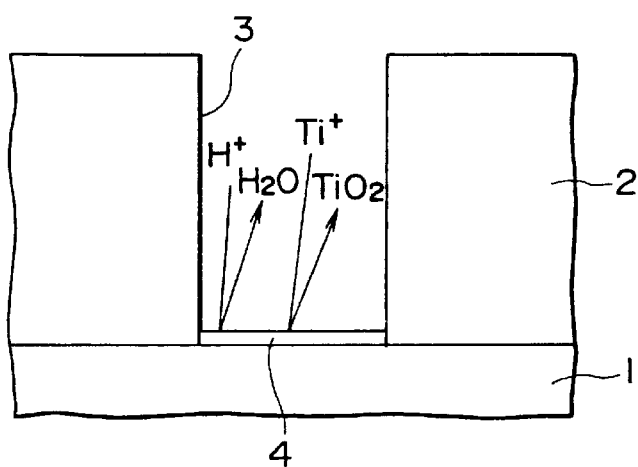
Figure 1C:
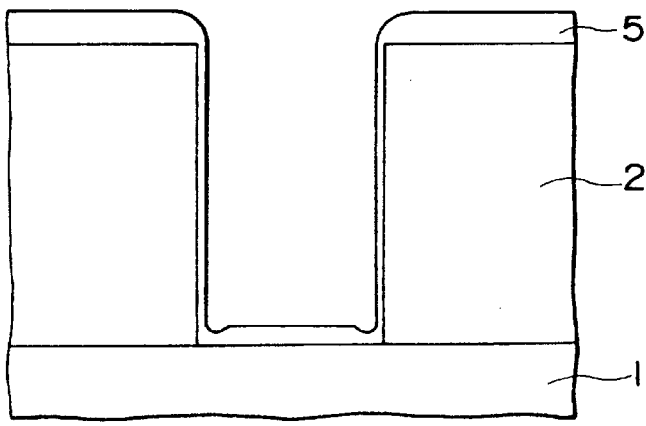

Referring to FIGS. 1A to 1C, which are schematic sectional views showing steps of the plasma CVD process of the present invention, the native oxide film 4 is, as described above, formed by re-oxidation on the bottom portion of the contact hole 3 (FIG. 1A). At the initial stage of the plasma CVD, vertically incident ions such as $H^+$, $Ar^+$ and $Ti^+$ accelerated by the differential sheath potential collide with the native oxide film 4. Of these ions, $H^+$ and $Ti^+$ react with the native oxide film 4, to remove the native oxide film 4 by chemical sputtering in which $H_2O$ and $TiO_2$ are generated. Also, $Ar^+$ removes the native oxide film 4 by the known physical sputtering (FIG. 1B).

A Ti film 5 being good in coverage is formed by vertical incident Ti ions over the entire surface of the substrate having the contact hole 3 from which the native oxide film 4 is removed, without occurrence of asymmetry of coverage. The coverage of the Ti film 5 is 50% which is expressed by a ratio between the film thickness of the bottom of the contact hole and the film thickness on the surface of the interlayer insulating film 2 (FIG. 1C). The coverage is good both at the central portion and the peripheral portion of the 8 inch-substrate 41 to be processed.

Since the Ti film 5 is formed in a state in which a clean surface of the diffusion layer is exposed at the bottom portion of the contact hole 3, a Ti silicide (not shown) is formed at the interface between the semiconductor substrate 1 and the Ti film 5, thereby allowing formation of a contact plug with a low resistance. After that, a TiN film is formed as needed, and the contact hole 3 is burried with an Al based metal or tungsten by blanket CVD, to form a contact plug or an upper interconnection.

According to this example, it is possible to form a contact being low in resistance to the semiconductor substrate made from silicon or the like and being high in uniformity.

EXAMPLE 2

Hereinafter, there will be described an example in which a contact metal formed of a Ti film in a via-hole opened facing an Al-based metal interconnection with reference to FIGS. 2A to 2C, FIGS. 6A and 6B, FIGS. 7A and 7B, and FIGS. 8A and 8B. It should be noted that in FIGS. 2A to 2C, parts similar to those shown in FIGS. 1A to 1C used for description of Example 1 are indicated by the same reference numerals.

A substrate to be processed in this example has a configuration shown in an enlarged sectional view of FIG. 2A. For example, the substrate to be processed is prepared by forming an insulating film (not shown), an Al based metal interconnection 10 and an interlayer insulating film 2 on a semiconductor substrate 1 (diameter: 8 inch), and forming a via-hole 3 facing the Al based metal interconnection 10. The Al based metal interconnection 10 has a layered structure of an Al interconnection 10a made from, for example, Al—1%Si alloy and a reflection preventive film 10b made from, for example, Tr. At the bottom portion of the via-hole 3, the reflection preventive film 10b is re moved and the Al interconnection 10a is exposed, and a native oxide film 4 is formed on the surface of the exposed Al interconnection 10a. However, at the bottom portion of the via-hole 3, the reflection preventive film 10B may remains, and in this case, the native oxide film 4 is formed on the surface of the reflection preventive film 10b. The thickness of the interlayer insulating film 2 is 2 μm and the opening diameter of the via-hole 3 is 0.2 μm. That is, the aspect ratio of the via-hole 3 is about 10. In addition, a number of the via-holes 3 each having the same shape are actually formed in a central area and a peripheral area of the 8 inch-substrate to be processed.

The substrate to be processed is then placed on the susceptor 42 of the ECR plasma CVD system shown in FIG. 4. A mixed gas of $H_2/Ar$ is introduced in the plasma generating chamber 30 through the gas inlet 33 and is excited by plasma due to discharge of ECR. At this time, $H_2$ is dissociated by collision with electrons in the plasma, to generate activated hydrogen species such as H atoms and H ions. This state is shown in FIG. 6A.

The plasma of the mixed gas of $H_2/Ar$ containing the activated hydrogen species is derived in the film forming chamber 40 by the gradient of the divergent magnetic field of the solenoid coil 34, and then TiCl$_4$ gas introduced into the film forming chamber 40 is reduced by the activated hydrogen species, to generate neutral species of Ti (see FIG. 6B). The generation of the neutral species of Ti can be monitored on the basis of peaks appearing at 374 nm and 453 nm in emission spectra.

One example of the plasma CVD condition is as follows:

flow rate of H$_2$: 80–140 sccm flow rate of Ar: 170–300 sccm flow rate of TiCl$_4$: 2–7 sccm microwave power: 2.8 kW (2.45 GHz)

substrate temperature: 300–460° C.

The neutral species of Ti generated by the above reduction collide with electrons and activated species of the noble gas, that is, Ar ions and excited Ar atoms in the plasma, to generate Ti ions as shown in FIG. 7A. The generation of Ti ions can be monitored in spectrometry of plasma emission on the basis of peaks appearing at 323 nm and 335 nm of Ti ions.

Besides, the other part of the TiCl$_4$ gas introduced from the gas ring 35 in the film forming chamber 40 collides with electrons and activated species of Ar in the plasma having an energy more than the ionizing energy of Ti, to directly generate Ti ions. At this time, a reaction by-product, Cl$_2$ as neutral species of the halogen, is reduced by the activated hydrogen species to be converted into hydrogen halide, that is, HCl which is readily exhausted from the chamber. This reduction is an exothermic reaction expressed by the following chemical equation and thereby it easily proceeds.

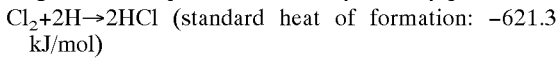

Cl$_2$+2H→2HCl (standard heat of formation: −621.3 kJ/mol)

This state is shown in FIG. 7B. At this time, the microwave power of the plasma CVD condition described above is selected such that the electrons and the activated species of Ar in the plasma have an energy more than the ionizing energy of Ti. Such an exciting state of the plasma is, as described in Example 1 with reference to FIG. 9, specified in spectrometry of plasma emission when a power for discharge of plasma is increased upon plasma CVD on the basis of a region in which the emission intensity of metal atoms is substantially saturated and the emission intensity of metal ions is increased.

The Ti ions thus generated by these reaction steps are directed toward the substrate 41 to be processed by the gradient of the divergent magnetic field 45 (see FIG. 8A).

Like Example 1, in this example, a mirror magnetic field 46 is produced by magnet coils 43 disposed under the susceptor 42 for preventing an obliquely incident component of the Ti ions due to the divergent magnetic field 45 from being not directly made incident on the substrate 41 to be processed. On the back surface of the susceptor 42 is formed the high permeability magnetic body (not shown). The vertically incident component of the Ti ions to the susceptor 42, which is enhanced by the mirror magnetic field 46, is further enhanced by the effect of the high permeability magnetic body functioning to attract the magnetic field.

In addition to the above, the Ti ions are accelerated by a differential sheath potential (self-bias) due to floating which is formed on the substrate 41 to be processed, and thereby they are made incident on the substrate 41 in the direction substantially perpendicular to the substrate 41 without any scattering, as shown in FIG. 8B. To prevent scattering of the Ti ions, a substrate bias being so weak as not to give ion damage to the substrate 41 may be applied to the susceptor 42.

Referring to FIGS. 2A to 2C, which are schematic sectional views showing steps of the plasma CVD process of the present invention, the native oxide film 4 such as Al$_2$O$_3$ or TiON is, as described above, formed on the bottom portion of the via-hole 3 (FIG. 2A) formed in the substrate to be processed. At the initial stage of the plasma CVD, vertically incident ions such as H$^+$, Ar$^+$ and Ti$^+$ accelerated by the differential sheath potential collide with the native oxide film 4. Of these ions, H$^+$ and Ti$^+$ react with the native oxide film 4, to remove the native oxide film 4 by chemical sputtering in which H$_2$O and TiO$_2$ are generated. Also, Ar$^+$ removes the native oxide film 4 such as Al$_2$O$_3$ or TiON by the known physical sputtering (FIG. 2B).

A Ti film 5 being good in coverage is formed by vertical incident Ti ions over the entire surface of the substrate 41 including the via-hole 3 from which the native oxide film 3 is removed, without occurrence of asymmetry of coverage. The coverage of the Ti film 5 is 50% which is expressed by a ratio between the film thickness of the bottom of the via-hole and the film thickness on the surface of the interlayer insulating film 2 (FIG. 2C). The coverage is good both at the central portion and the peripheral portion of the 8 inch-substrate 41 to be processed.

Since the Ti film 5 is formed in a state in which a clean surface of the Al based metal interconnection 10 is exposed at the bottom portion of the via-hole 3, a via-contact plug with a low resistance can be formed. After that, a TiN film is formed as needed, and the via-hole 3 is buried with an Al based metal or tungsten by blanket CVD, to form a contact plug or an upper interconnection.

According to this example, it is possible to form a via-contact being low in resistance to the semiconductor substrate made from silicon or the like and being high in uniformity.

EXAMPLE 3

In this example, the plasma CVD process of the present invention is applied to a salicide process in which a silicide layer is formed on a source/drain diffusion layer in self-alignment to reduce the resistance of the diffusion layer, thereby improving an operational speed of a MOS transistor device. Such an example will be described with reference to FIGS. 3A to 3C, FIGS. 6A and 6B, FIGS. 7A and 7B, and FIGS. 8A and 8B.

Figure 3A:
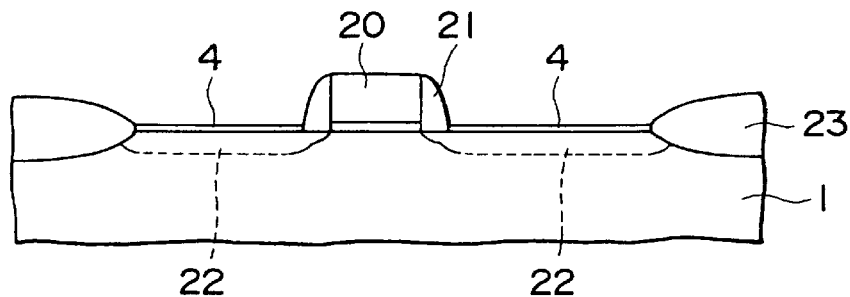
FIGS. 3A to 3D are schematic sectional views showing steps of a further plasma CVD process of the present invention.

A substrate to be processed in this example has a configuration shown in an enlarged sectional view of FIG. 3A. For example, the substrate to be processed is prepared by forming, in an element forming region surrounded by LOCOS regions 23 formed on a semiconductor substrate 1 made from silicon or the like, a gate electrode 20 with a LDD side wall spacer 21 and an impurity diffusion layer 22 by a known process.

A native oxide film and a contaminant on the surface of the impurity diffusion layer 22 are cleaned by diluted hydrofluoric acid. The substrate to be processed is then placed on the susceptor 42 of the ECR plasma CVD system shown in FIG. 4. A new native oxide film 4 is thinly formed on the surface of the impurity diffusion layer 22. A mixed gas of H$_2$/Ar is introduced in the plasma generating chamber 30 and excited by plasma generated through discharge of ECR. At this time, H$_2$ is dissociated by collision with electrons in the plasma, to generate activated hydrogen species such as H atoms and H ions. This state is shown in FIG. 6A.

The plasma of the mixed gas of H$_2$/Ar containing the activated hydrogen species is derived in the film forming chamber 40 by the gradient of the divergent magnetic field of the solenoid coil 34, and TiCl₄ gas introduced into the film forming chamber 40 is reduced by the activated hydrogen species, to generate neutral species of Ti (see FIG. 6B). The generation of the neutral species of Ti can be monitored on the basis of peaks appearing at 374 nm and 453 nm in emission spectra.

One example of the plasma CVD condition is as follows:

flow rate of H₂: 80–140 sccm flow rate of Ar: 170 sccm flow rate of TiCl₄: 3–7 sccm microwave power: 2.8 kW (2.45 GHz)

substrate temperature: 300–460° C.

The neutral species of Ti generated by the above reduction collide with electrons and activated species of the noble gas, that is, Ar ions and excited Ar atoms in the plasma, to generate Ti ions, as shown in FIG. 7A. The generation of Ti ions can be monitored in spectrometry of plasma emission on the basis of peaks appearing at 323 nm and 335 nm of Ti ions.

Besides, the other part of the TiCl₄ gas introduced from the gas ring 35 in the film forming chamber 40 collides with electrons and activated species of Ar in the plasma having an energy more than the ionizing energy of Ti, to directly generate Ti ions. At this time, a reaction by-product, Cl₂ as neutral species of the halogen, is reduced by the activated hydrogen species to be converted into hydrogen halide, that is, HCl which is readily exhausted from the chamber. This reduction is an exothermic reaction expressed by the following chemical equation and thereby it easily proceeds.

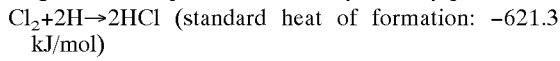
Cl₂+2H→2HCl (standard heat of formation: −621.3 kJ/mol)

This state is shown in FIG. 7B. At this time, the microwave power of the plasma CVD condition described above is selected such that the electrons and the activated species of Ar in the plasma have an energy more than the ionizing energy of Ti. Such an exciting state of the plasma is, as described in Example 1 with reference to FIG. 9, specified in spectrometry of plasma emission when a power for discharge of plasma is increased upon plasma CVD on the basis of a region in which the emission intensity of metal atoms is substantially saturated and the emission intensity of metal ions is increased.

The Ti ions thus generated by these reaction steps are derived toward the substrate 41 to be processed by the gradient of the divergent magnetic field 45 (see FIG. 8A).

Like Examples 1 and 2, in this example, a mirror magnetic field 46 is formed by the electromagnet 43 disposed under the susceptor 42 for preventing an obliquely incident component of the Ti ions due to the divergent magnetic field 45 from being not directly made incident on the substrate 41 to be processed. The high permeability magnetic body (not shown) is disposed on the back surface of the susceptor 42. The vertically incident component of the Ti ions to the susceptor 42, which is enhanced by the mirror magnetic field 46, is further enhanced by the effect of the high permeability magnetic body functioning to attract the magnetic field.

In addition to the above, the Ti ions are accelerated by a differential sheath potential (self-bias) due to floating which is formed on the substrate 41 to be processed, and thereby they are made incident on the substrate 41 in the direction substantially perpendicular to the substrate 41 without any scattering, as shown in FIG. 8B. To prevent scattering of the Ti ions, a substrate bias being so weak as not to give ion damage to the substrate 41 may be applied to the susceptor 42.

Figure 3B:
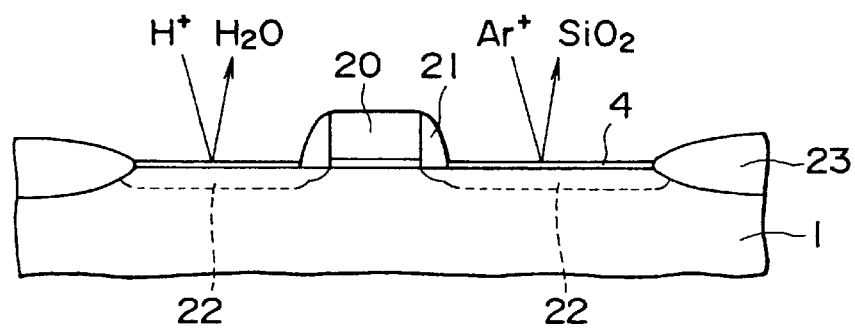

The native oxide film 4 is formed on the surface of the impurity diffusion layer 22, and at the initial stage of the plasma CVD, vertically incident ions such as H⁺, Ar⁺ and Ti⁺ accelerated by the differential sheath potential collide with the native oxide film 4. of these ions, H⁺ and Ti⁺ react with the native oxide film 4, to remove the native oxide film 4 by chemical sputtering in which H₂O and TiO₂ are generated. Also, Ar⁺ removes the native oxide film 4 such as Al₂O₃ and TiON by the known physical sputtering (FIG. 3B).

Figure 3C:
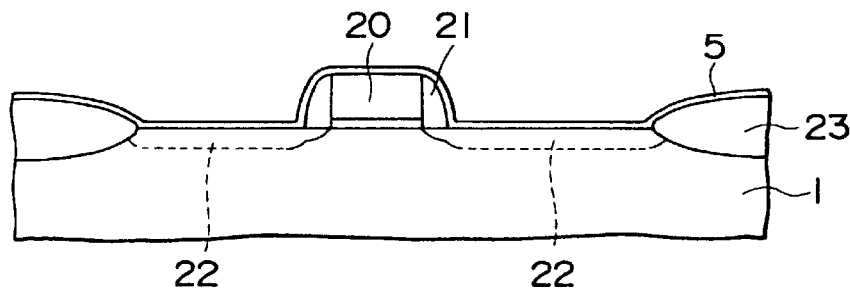

A Ti film 5 having a good coverage and a uniform thickness is formed by vertical incident Ti ions over the entire surface of the substrate 41 including the surface of the impurity diffusion layer 22 from which the native oxide film 4 is removed, without occurrence of asymmetry of coverage even on the side surface of the LDD side wall spacer 21 and on the surface of the impurity diffusion layer 22 directly under the spacer 21 (see FIG. 3C). The coverage of the Ti film 5 is good both at the central portion and peripheral portion of the 8 inch-substrate 41 to be processed.

In this plasma CVD process, since the Ti film 5 is formed in a state in which the surface of the impurity diffusion layer 22 is activated by cleaning, the Ti film 5 easily reacts with silicon on the surface of the impurity diffusion layer 22, and thereby a Ti—Si reactive layer (not shown) is already formed at a substrate temperature of 300 to 460° C. upon plasma CVD.

Figure 3D:
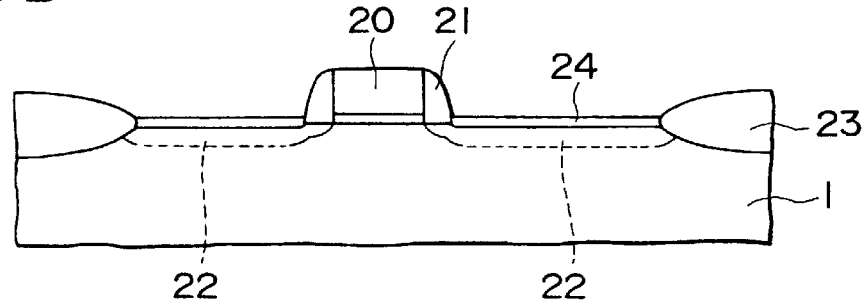

After that, the silicidation on the impurity diffusion layer 22 is promoted by RTA performed in a nitrogen atmosphere at a temperature of 650° C. for 30–60 seconds. The unreacted Ti film 5 on the LDD side wall spacer 21 and on the LOCOS regions 23 are removed by wet-etching, followed by RTA performed in Ar at a temperature of 800° C. for 30 seconds. This heat-treatment converts TiSi₂ formed in self-alignment on the impurity diffusion layer 22 from a metastable C49 phase to a stable C54 phase with a low resistance, to thus form a TiSi₂ layer 24 of the C54 phase (see FIG. 3D). In the case where polycrystalline silicon is exposed on an upper surface of a gate electrode 20, the TiSi₂ layer is also formed on the gate electrode 20.

The above step is followed by steps of forming an interlayer insulating film, opening a contact hole, and the like, in accordance with a known process, to thus accomplish a MOS transistor.

According to this example, since the Ti—Si reactive layer is already formed on the surface of the impurity diffusion layer 22 upon plasma CVD of the Ti film 5, and it acts as a nucleus for stably promoting phase transition into the C54 silicide phase. Accordingly, it is possible to eliminate a so-called thin line effect in which phase transition from the C49 to the C54 silicide phase becomes difficult on the gate electrode having a fine width, and hence to stably form the thin, uniform TiSi₂ layer 24 with a low resistance.

Next, a process of forming a metal nitride film according to the present invention will be described with reference to the following fourth and fifth examples.

EXAMPLE 4

In this example, a metal nitride film made from TiN having a specific thickness is formed by repeating a step of forming a metal film made from Ti using an ECR plasma CVD system and a step of nitriding the metal film by plasma nitriding using the same ECR plasma CVD system.

The ECR plasma CVD system adopted in this example is the same as that described in Examples 1 to 3 with reference to FIG. 4, and therefore, the explanation thereof is omitted.

Further, a substrate to be processed adopted in this example and the former step of forming the metal film made from Ti are similar to those described in Example 1 with reference to FIGS. 1A to 1C, FIGS. 6A and 6B, FIGS. 7A and 7B, and FIGS. 8A and 8B, and therefore, the explanation thereof is omitted. In this example, however, the thickness of the Ti film 5 shown in FIG. 1C is set to be in a range of 3 to 10 nm.

The latter step of nitriding the metal film by plasma nitriding in this example will be described in detail with reference to FIGS. 10 and 11. It should be noted that in FIG. 10, reference numerals indicating parts of the system are omitted for simplification.

FIG. 11 is a schematic sectional view showing steps of forming a metal nitride film. Referring to FIG. 11, an interlayer insulating film 2 is formed on a semiconductor substrate 1 made from silicon or the like to a thickness of 2 $\mu$m, and a contact hole 3 having a diameter of 0.2 $\mu$m is opened. The Ti film 5 is formed over the entire surface of the substrate to be processed to a thickness of, for example, 5 nm. The Ti film 5 is formed in accordance with the plasma CVD process in Example 1. The Ti film thus formed has a good coverage (50%).

The substrate to be processed is set on the susceptor 42 of the ECR plasma CVD system shown in FIG. 10. A mixed gas of $N_2$, $H_2$, and Ar is introduced in the plasma forming chamber 30, and is excited by plasma due to discharge of ECR.

At this time, $N_2^+$ is generated by collision of $N_2$ with electrons, and H atoms and $H^+$ are generated by collision of $H_2$ with electrons.

Next, active NH is generated by reaction of $N_2^+$ with H, and is then derived toward the substrate 41 on the susceptor 42. The generation of NH can be confirmed in spectrometry of plasma on the basis of emission of NH appearing at 336 nm.

The NH reaching the substrate 41 is adsorbed on the surface of the previously formed Ti film 5, to be dissociated into N and H. The active N atoms react with lattices of Ti in the Ti film 5. Such plasma nitriding forms TiN (see FIG. 11A).

The plasma CVD step for forming the Ti film 5 and the plasma nitriding step are three times repeated, to form a TiN film 51 having a specific thickness (FIG. 11B).

After that, the contact hole 3 is buried with an Al based metal or tungsten by blanket CVD, to form a contact plug or an upper interconnection (not shown).

According to this example, the TiN film 51 has a shape without such a necking portion and asymmetry as to block an opening portion of the contact hole 3. Further, the TiN film 51 is formed such that it is thin at a side wall of the contact hole 3 and is thick at a bottom portion of the contact hole 3, so that the contact hole, even if it has a fine opening diameter, can be buried with W by blanket CVD or the like without occurrence of any void in the contact hole 3 at the subsequent step. The shape of the TiN film 51 cannot be achieved by the method of forming a TiN film by thermal CVD in which the TiN film is formed such that thicknesses thereof at a side wall and a bottom portion of the contact hole are nearly equal to each other.

Further, in this example, by previously forming a thick Ti film having a thickness of, for example, 20 nm by plasma CVD and nitriding the Ti film by plasma nitriding, it is possible to obtain a double layer structure of Ti film/TiN film in which only the surface side of the Ti film is nitrided.

EXAMPLE 5

In this example, a TiN film having a specific thickness is formed by repeating a step of forming a Ti film using ion species of Ti produced by ionizing of Ti particles generated by sputtering, and a step of nitriding the Ti film by plasma nitriding. Such an example will be described with reference to FIG. 5, FIGS. 1A to 1C, and FIG. 11. Here, it is important to provide a shutter mechanism in front of a Ti target of the sputtering system for preventing nitriding of the Ti target.

A substrate to be processed adopted in this example is the same as that described in Example 1 with reference to FIG. 1A, and therefore, the explanation thereof is omitted.

Referring to FIG. 1A, a native oxide film and a contaminant on the surface of a portion of a semiconductor substrate 1 exposed at a bottom portion of a contact hole 3 are cleaned by diluted hydrofluoric acid. The substrate to be processed is then placed on the susceptor 42 of the sputtering system shown in FIG. 5. A new native oxide film 4 is thinly formed on the bottom portion of the contact hole 3.

By introducing Ar gas from the gas inlet (not shown), and applying a DC voltage for sputtering to a Ti target, Ti particles are generated. At this time, a RF power is supplied from the ICP power supply to the ICP coil 53, to ionize the Ti particles thus sputtered by collision with Ar ions and electrons in the ICP plasma. Then, the Ti ions thus generated are made incident on the substrate 41 to be processed in the direction substantially perpendicular to the substrate 41 by applying a substrate bias to the susceptor 42.

On example of the sputtering condition is as follows:

sputtering power: 5 kW (DC)

ICP power: 1.5 kW (2 MHz)

substrate bias power: 0.12 kW (13.56 MHz)

pressure: 30–50 mTorr.

At the initial stage of this sputtering step, vertically incident ions such as $H^+$, $Ar^+$ and $Ti^+$ accelerated by the substrate bias collide with the native oxide film 4. Of these ions, $H^+$ and $Ti^+$ react with the native oxide film 4, to remove the native oxide film 4 by chemical sputtering in which $H_2O$ and $TiO_2$ are generated. Also, $Ar^+$ removes the native oxide film 4 by the known physical sputtering (FIG. 1B).

A Ti film 5 being good in coverage is formed by vertical incident Ti ions over the entire surface of the substrate 41 having the contact hole 3 from which the native oxide film 4 is removed, without occurrence of asymmetry of coverage. The suitable thickness of the Ti film 5 is in a range of 3 to 10 $\mu$m. The coverage of the Ti film 5 is 50% which is expressed by a ratio between the film thickness of the bottom of the contact hole and the film thickness on the surface of the interlayer insulating film 2 (FIG. 1C). The coverage is good both at the central portion and the peripheral portion of the 8 inch-substrate 41 to be processed.

The latter plasma nitriding step in this example will be described with reference to FIG. 11.

In the same sputtering system, a shutter 52 disposed in front of a Ti target 54 is closed to shield the Ti target 54. Then, a mixed gas of $N_2$, $H_2$ and Ar is introduced and is excited by plasma due to discharge of ICP. In the plasma, $N_2^+$, H atoms and $H^+$ are generated by collision of $N_2$, $H_2$ with electrons, and active NH is generated by reaction of $N_2^+$ with H atoms. The generation of NH can be confirmed in spectrometry of plasma on the basis of emission of NH appearing at 336 nm.

The NH reaching the surface of the substrate 41 is adsorbed on the surface of the previously formed Ti film 5, to be dissociated into N and H (see FIG. 11A). The active N atoms immediately react with the Ti film 5. Such plasma nitriding forms TiN.

The sputtering step for forming the Ti film 5 and the plasma nitriding step are three times repeated, to form a TiN film 51 having a specific thickness (FIG. 11B).

After that, the contact hole 3 is buried with an Al based metal by sputtering or tungsten by blanket CVD, to form a contact plug or an upper interconnection.

According to this example, the TiN film has a good shape without such an overhang, necking portion or asymmetry as to block an opening portion of the contact hole 3. Further, the TiN film is formed such that it is thin at a side wall of the contact hole 3 and is thick at a bottom portion of the contact hole 3, so that the contact hole, even if it has a fine opening diameter, can be buried with Al or W without occurrence of any void in the contact hole 3. The shape of the TiN film 51 cannot be achieved by the method of forming a TiN film by thermal CVD in which the TiN film is formed such that thicknesses thereof at a side wall and a bottom portion of the contact hole are nearly equal to each other.

Further, in this example, by previously forming a thick Ti film having a thickness of, for example, 20 nm by sputtering and nitriding the Ti film by plasma nitriding, it is possible to obtain a double layer structure of Ti film/TiN film in which the surface layer of the Ti film is nitrided.

While the plasma CVD process for a metal film, a formation process for a metal nitride film, and a semiconductor device using the film formed by such a process according to the present invention have been described in detail using the five examples, such description is for illustrative purposes only, and it should be understood that many changes and variations may be made without departing from the scope of the present invention. For example, $TiCl_4$ is used as a metal halide in the examples; however, the present invention is not limited thereto. The above-described various titanium halides can be of course used. Further, it is apparent that the technical thought of the present invention can be applied to formation of a metal film by plasma CVD using a metal halide other than a titanium halide.

The present invention can be also applied to formation of a high melting point metal nitride film functioning as a barrier metal layer, in addition to the TiN film as a metal nitride film described in the above examples.

Although in the above examples, the substrate to be processed on which a metal film is to be formed is represented by a silicon substrate having a contact hole facing a diffusion layer, a semiconductor substrate having a contact hole facing an Al based metal interconnection or a silicon substrate using a salicide process, the present invention is not limited thereto. As the substrate to be processed, there may used a semiconductor substrate having a via-hole facing an interconnection layer made from polycrystalline silicon or other substances to be processed such as a wear resisting coating to a track surface of a magnetic recording/reproducing head.

In the above examples, the ECR plasma CVD is used as the plasma CVD system; however, the effect of the plasma CVD process of the present invention can be obtained using other CVD systems using divergent magnetic field, for example, a helicon wave plasma CVD system. Further, by use of optical plasma CVD capable of irradiating an exciting optical beam such as a low pressure Hg lamp or excimer laser in combination with plasma, it is possible to make use of a reaction with a higher reduction efficiency.

As described above, the plasma CVD process of the present invention is allowed to form a metal film being good in shape, symmetry, and homology without occurrence of corrosion of an underlaying silicon substrate and/or a metal interconnection, and also to reduce the content of a halogen remaining in the metal film.

The formation process for a metal nitride film of the present invention is allowed to form a metal nitride film being good in shape, symmetry and adhesion.

Accordingly, by use of the above metal film or metal nitride film as an electrode/interconnection material layer, it is possible to provide a high integrated semiconductor device which is low in resistance and high in reliability, for example, without occurrence of corrosion of an interconnection.

What is claimed is:

1. A plasma CVD process for forming a metal film on a substrate to be processed using a source gas containing a metal halide gas, hydrogen gas, and a noble gas, said process comprising the steps of:

reducing the metal halide by activated hydrogen species in a plasma to generate neutral species of a metal;

making the neutral species of the metal collide with at least one kind of activated species of the noble gas and electrons in the plasma to generate metal ions;

making the metal halide collide with at least one kind of the activated species of the noble gas and the electrons in the plasma to generate metal ions and neutral species of a halogen;

reducing the neutral species of the halogen by the activated hydrogen species in the plasma to generate a hydrogen halide; and making the metal ions thus generated incident on a principal surface of the substrate to be processed in the direction substantially perpendicular to the principal surface.

2. A plasma CVD process for forming a metal film according to claim 1, wherein the activated hydrogen species are generated by plasma-exciting of the hydrogen gas and the noble gas.

3. A plasma CVD process for forming a metal film according to claim 1, wherein said step of generating the neutral species of the metal and said step of making the neutral species of the metal collide with at least one kind of the activated species of the noble gas and the electrons in the plasma to generate the metal ions are monitored by emission spectra of the neutral species of the metal and the metal ions in spectrometry of plasma emission upon said plasma CVD.

4. A plasma CVD process for forming a metal film according to claim 1, wherein said step of making the metal halide collide with at least one kind of the activated species of the noble gas and the electrons in the plasma to generate the metal ions is carried out in a plasma-exciting state containing at least one kind of the activated species of the noble gas and the electrons having an energy more than a metal ionizing energy.

5. A plasma CVD process for forming a metal film according to claim 4, wherein the plasma-exciting state containing at least one kind of the activated species of the noble gas and the electrons having an energy more than a metal ionizing energy is specified, in spectrometry of plasma emission when a power for discharge is increased upon the plasma CVD, on the basis of a region in which an emission intensity of the metal atoms is substantially saturated and an emission intensity of the metal ions is increased.

6. A plasma CVD process for forming a metal film according to claim 1, wherein a means for making the metal ions incident on the principal surface of the substrate to be processed in the direction substantially perpendicular to the principal surface comprises a divergent magnetic field for deriving the metal ions from the plasma and a mirror magnetic field produced by magnetic coils located under a susceptor.

7. A plasma CVD process for forming a metal film according to claim 6, wherein said means for making the metal ions incident on the principal surface of the substrate to be processed in the direction substantially perpendicular to the principal surface further comprises a high permeability magnetic body disposed on the back surface of the susceptor.

8. A plasma CVD process for forming a metal film according to claim 1, wherein the substrate to be processed has on its principal surface a stepped portion and a conductive material layer exposed at a bottom portion of the stepped portion; and at an initial stage of the plasma CVD, before formation of the metal film, a native oxide film on a surface of the conductive material layer is sputtered by the metal ions and the noble gas ions and also reduced by the activated hydrogen species to be thus removed.

9. A plasma CVD process for forming a metal film according to claim 1, wherein the metal halide gas comprises $TiCl_4$ gas and the metal film comprises a Ti film.

10. A plasma CVD process for forming a metal film according to claim 1, wherein said noble gas comprises Ar gas.

11. A process for forming a metal nitride film by nitriding a metal film formed on a substrate to be processed, comprising the steps of:

forming the metal film on the substrate to be processed by plasma CVD using a source gas containing a metal halide gas, hydrogen gas, and a noble gas;

nitriding the metal film thus formed by plasma nitriding; and repeating a plurality of times said step of forming the metal film and said step of nitriding the metal film thus formed;

wherein said step of forming the metal film by plasma CVD further comprises the steps of:

reducing the metal halide by activated hydrogen species in a plasma to generate neutral species of a metal;

making the neutral species of the metal collide with at least one kind of activated species of the noble gas and electrons in the plasma to generate metal ions;

making the metal halide collide with at least one kind of the activated species of the noble gas and the electrons in the plasma to generate metal ions and neutral species of a halogen;

reducing the neutral species of the halogen by the activated hydrogen species in the plasma to generate a hydrogen halide; and making the metal ions thus generated incident on a principal surface of the substrate to be processed in the direction substantially perpendicular to the principal surface.

12. A plasma CVD process for forming a metal nitride film according to claim 11, wherein the activated hydrogen species are generated by plasma-exciting of the hydrogen gas and the noble gas.

13. A plasma CVD process for forming a metal nitride film according to claim 11, wherein said step of generating the neutral species of the metal and said step of making the neutral species of the metal collide with at least one kind of the activated species of the noble gas and the electrons in the plasma to generate the metal ions are monitored by emission spectra of the neutral species of the metal and the metal ions in spectrometry of plasma emission upon said plasma CVD.

14. A plasma CVD process for forming a metal nitride film according to claim 11, wherein said step of making the metal halide collide with at least one kind of the activated species of the noble gas and the electrons in the plasma to generate the metal ions is carried out in a plasma-exciting state containing at least one kind of the activated species of the noble gas and the electrons having an energy more than a metal ionizing energy.

15. A plasma CVD process for forming a metal nitride film according to claim 14, wherein the plasma-exciting state containing at least one kind of the activated species of the noble gas and the electrons having an energy more than a metal ionizing energy is specified, in spectrometry of plasma emission when a power for discharge is increased upon the plasma CVD, on the basis of a region in which an emission intensity of the metal atoms is substantially saturated and an emission intensity of the metal ions is increased.

16. A process for forming a metal nitride film according to claim 11, wherein said step of forming the metal nitride film by plasma nitriding comprises steps of plasma-exciting either a mixed gas of nitrogen gas, hydrogen gas and a noble gas or ammonia gas, and plasma-nitriding the metal film by activated nitrogen species generated in the plasma.

17. A process for forming a metal nitride film according to claim 16, wherein generation of the nitrogen based activated species is monitored by emission spectra of chemical species of NH in spectrometry of plasma emission upon said plasma nitriding.

18. A plasma CVD process for forming a metal nitride film according to claim 11, wherein a means for making the metal ions incident on the principal surface of the substrate to be processed in the direction substantially perpendicular to the principal surface comprises a divergent magnetic field for deriving the metal ions from the plasma and a mirror magnetic field produced by magnetic coils located under the susceptor.

19. A plasma CVD process for forming a metal nitride film according to claim 18, wherein said means for making the metal ions incident on the principal surface of the substrate to be processed in the direction substantially perpendicular to the principal surface further comprises a high permeability magnetic body disposed on the back surface of the substrate to be processed.

20. A plasma CVD process for forming a metal nitride film according to claim 11, wherein the substrate to be processed has on its principal surface a stepped portion and a conductive material layer exposed at a bottom portion of the stepped portion; and at an initial stage of the plasma CVD, before formation of the metal film, a native oxide film on a surface of the conductive material layer is sputtered by the metal ions and the noble gas ions and also reduced by the activated hydrogen species to be thus removed.

21. A plasma CVD process for forming a metal nitride film according to claim 11, wherein the metal halide gas comprises $TiCl_4$ gas; the metal film comprises a Ti film; and the metal nitride film comprises a TiN film.

22. A plasma CVD process for forming a metal nitride film according to claim 11, wherein said noble gas comprises Ar gas.

23. A process for forming a metal nitride film by nitriding a metal film formed on a substrate to be processed, comprising the steps of:

forming the metal film on the substrate to be processed by sputtering a metal target using noble gas ions, making metal particles thus sputtered collide with at least one kind of the noble gas ions and electrons to generate metal ions, and applying a substrate bias to the substrate to be processed to make the metal ions incident on a principal surface of the substrate to be processed in the direction substantially perpendicular to the principal surface;

nitriding the metal film thus formed by plasma nitriding; and repeating a plurality of times said step of forming the metal film and said step of nitriding the metal film, thereby forming a metal nitride film to a specific thickness.

24. A process for forming a metal nitride film according to claim 23 of wherein said step of forming the metal nitride film by plasma nitriding comprises steps of plasma-exciting either a mixed gas of nitrogen gas, hydrogen gas and a noble gas or ammonia gas, and plasma-nitriding the metal film by activated nitrogen species generated in the plasma.

25. A process for forming a metal nitride film according to claim 24, wherein generation of the nitrogen based activated species is monitored by emission spectra of chemical species of NH in spectrometry of plasma emission upon said plasma nitriding.

26. A process for forming a metal nitride film according to claim 23, wherein in said step of nitriding the metal film by plasma nitriding, the metal target is prevented from being nitrided by provision of a shutter means in proximity to a surface of the metal target.

27. A process for forming a metal nitride film according to claim 23, wherein the metal film comprises a Ti film; and the metal nitride film comprises a TiN film.

28. A process for forming a metal nitride film according to claim 23, wherein said noble gas comprises Ar gas.

* * * * *